(12) United States Patent
Fujinuma

(10) Patent No.: US 7,693,692 B2
(45) Date of Patent: Apr. 6, 2010

(54) CAD SYSTEM AND DESIGNING/ANALYZING METHOD

(75) Inventor: Tomohisa Fujinuma, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 412 days.

(21) Appl. No.: 11/785,499

(22) Filed: Apr. 18, 2007

(65) Prior Publication Data

US 2007/0255537 A1 Nov. 1, 2007

(30) Foreign Application Priority Data

Apr. 28, 2006 (JP) .............................. 2006-127064

(51) Int. Cl.
*G06F 17/50* (2006.01)
*G06F 9/00* (2006.01)
(52) U.S. Cl. .............................. 703/2; 703/6; 707/104; 434/365
(58) Field of Classification Search ...................... 703/2, 703/6; 707/4, 104; 434/365
See application file for complete search history.

(56) References Cited

U.S. PATENT DOCUMENTS

2004/0249809 A1* 12/2004 Ramani et al. .................. 707/4

2006/0199167 A1* 9/2006 Yang et al. .................. 434/365

FOREIGN PATENT DOCUMENTS

| JP | 2002-183220 | 6/2002 |
|----|-------------|--------|
| JP | 2004-213107 | 7/2004 |
| JP | 2005-215997 | 8/2005 |

* cited by examiner

*Primary Examiner*—Thai Phan
(74) *Attorney, Agent, or Firm*—Pillsbury Winthrop Shaw Pittman, LLP

(57) ABSTRACT

According to one embodiment, a CAD system includes a model building section which builds a total model by combining shape models of frame components and internal components of a designed appliance, a design verification simulation executing section which executes analysis simulation which serves design verification by running a simulation of the total model built by the model building section in accordance with a design specification, and a simulation result manipulating section which forms a model from the total model modified in accordance with a result of the analysis executed by the design verification simulation executing section.

11 Claims, 5 Drawing Sheets

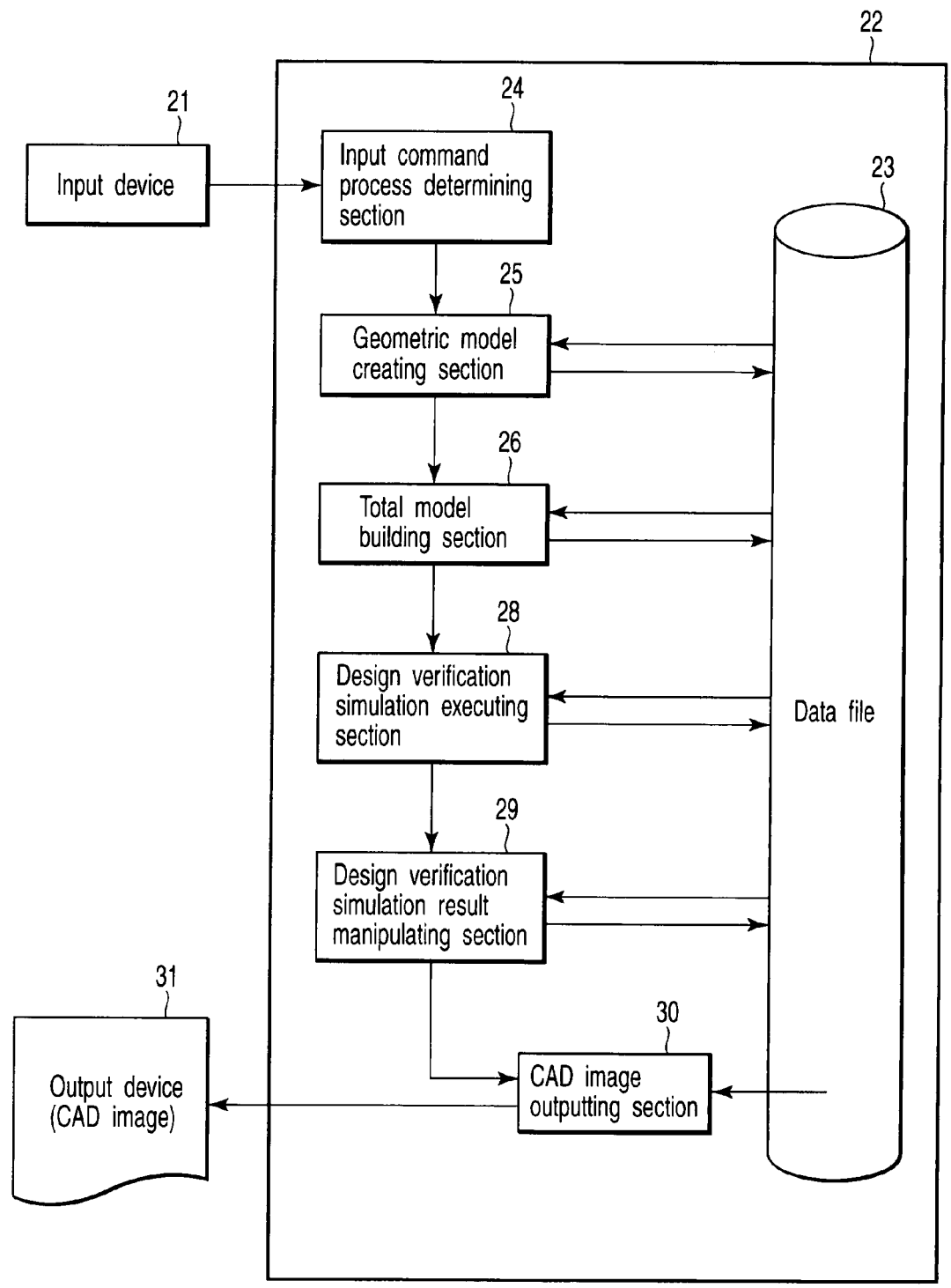
F I G. 1

CAD SYSTEM AND DESIGNING/ANALYZING METHOD

CROSS-REFERENCE TO RELATED APPLICATIONS

This application is based upon and claims the benefit of priority from Japanese Patent Application No. 2006-127064, filed Apr. 28, 2006, the entire contents of which are incorporated herein by reference.

BACKGROUND

1. Field

The present invention relates to a CAD system and a designing/analyzing method for designing electronic appliance and analyzing a model that is designed.

2. Description of the Related Art

A common computer-aided engineering (CAE) system performs CAE analysis only after creating shape data on a computer-aided diagnosis (CAD) system and then preparing a CAE analysis model on the CAE system.

The shape data is transferred from the CAD system to the CAE system, but information necessary for the CAE analysis such as boundary conditions, load conditions, component connecting elements and magnetic noise source origins is not conveyed. The CAD designing and the CAE analyzing are often performed in parallel but by different persons. In such a case, the person for CAE analysis may have to input necessary information into the CAE system while thinking on or asking for such information. In addition, as the CAD designing proceeds, the CAE analysis may need to be largely modified or redone.

Jpn. Pat. Appln. KOKAI Publication No. 2004-213107 discloses a technology of building a model of an overall structure by combining shape models of incorporated components together, then inputting design standard data on dimensions and strengths, and rebuilding the total model by making changes to the shape data if the results of the analysis show that the design standards are not satisfied.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is an exemplary block diagram that shows the entire structure of a design verification simulation CAD system according to an embodiment of the present invention;

DETAILED DESCRIPTION

Figure 2:
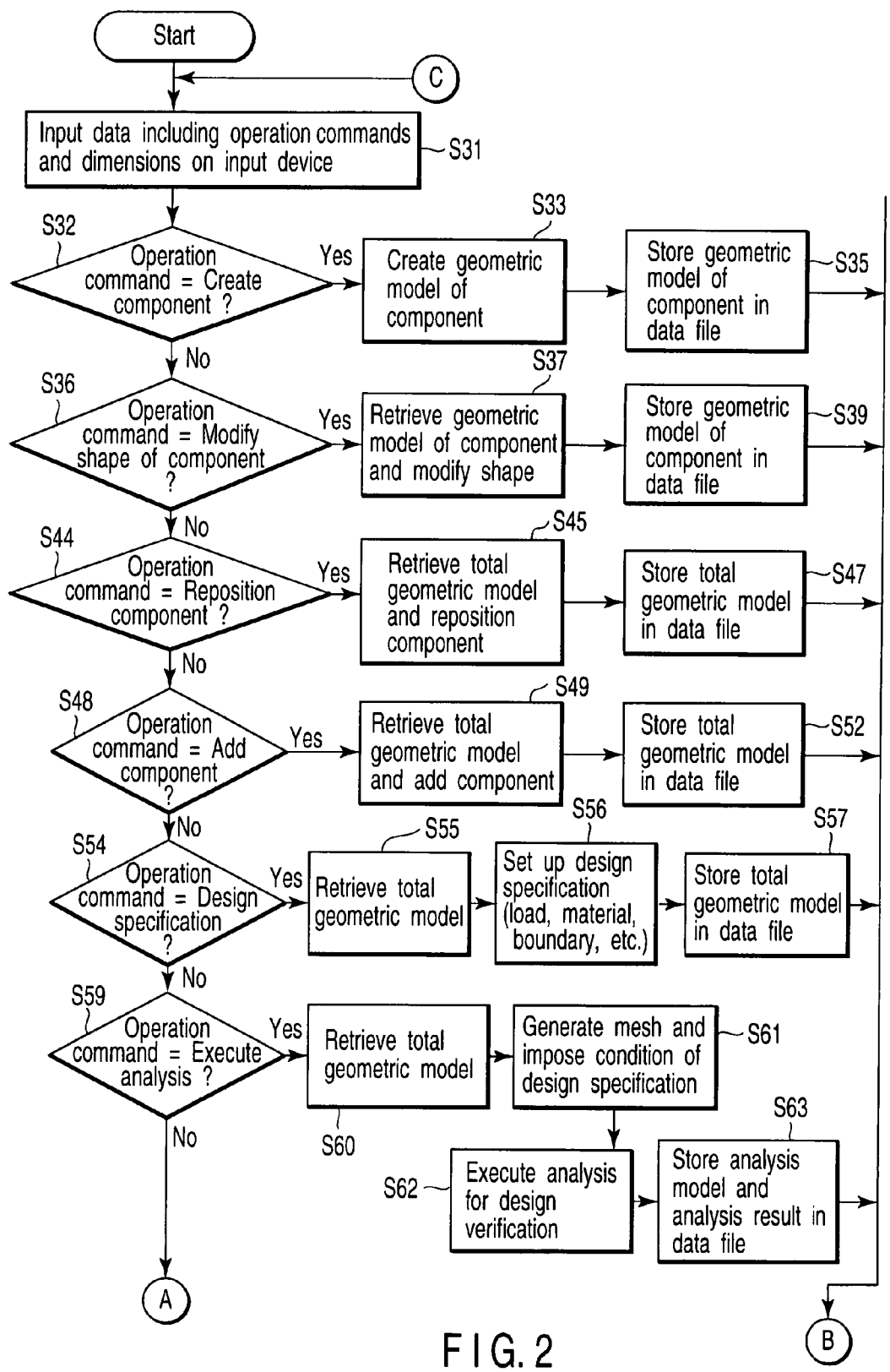
FIG. 2 is an exemplary flowchart that shows an operation of the design verification simulation CAD system.

Various embodiments according to the invention will be described hereinafter with reference to the accompanying drawings. In general, according to one embodiment of the invention, a CAD system comprises a model building section which builds a total model by combining shape models of frame components and internal components of a designed appliance, a design verification simulation executing section which executes analysis simulation which serves design verification by running a simulation of the total model built by the model building section in accordance with a design specification, and a simulation result manipulating section which forms a model from the total model modified in accordance with a result of the analysis executed by the design verification simulation executing section.

FIG. 1 is a block diagram that shows the entire structure of a design verification simulation CAD system according to an embodiment of the present invention.

The design verification simulation CAD system is constituted mainly with an input device 21, a system main section 22 and an output device 31.

The system main section 22 comprises a data file storing section 23, an input command process determining section 24, a shape model creating section 25, a total model building section 26, a design verification simulation executing section 28, a design verification simulation result manipulating section 29 and a CAD image outputting section 30.

The input device 21 is a unit on which an operator inputs, into the system main section 22, shape data such as dimensions of components for the frame sections of a designed appliance as well as dimensions of internal components to be installed in the appliance by referring to a design specification and plans of the appliance.

The data file storing section 23 stores therein a shape model created by the shape model creating section 25 and a total model created by the total model building section 26, as well as data processed by the design verification simulation executing section 28 and the design verification simulation result manipulating section 29.

The shape model creating section 25 creates shape models on the basis of the shape data on the frame components and internal components that is input on the input device 21.

The total model building section 26 combines the shape models created by the shape model creating section 25 into a total model.

The design verification simulation executing section 28 executes analysis by generating a mesh and creating an analysis model with boundary conditions set up on the basis of the design specification so as to execute analysis simulation, which serves as design verification.

The design verification simulation result manipulating section 29 retrieves the total shape model, analysis model and analysis results from the data file storing section 23, and incorporates the analysis model and the analysis results into the total shape model to create a shape model.

The CAD image outputting section 30 retrieves the results of analyzing the total shape model from the data file storing section 23, and prepares data of the analysis results and CAD image to display on the output device 31.

Figure 3:
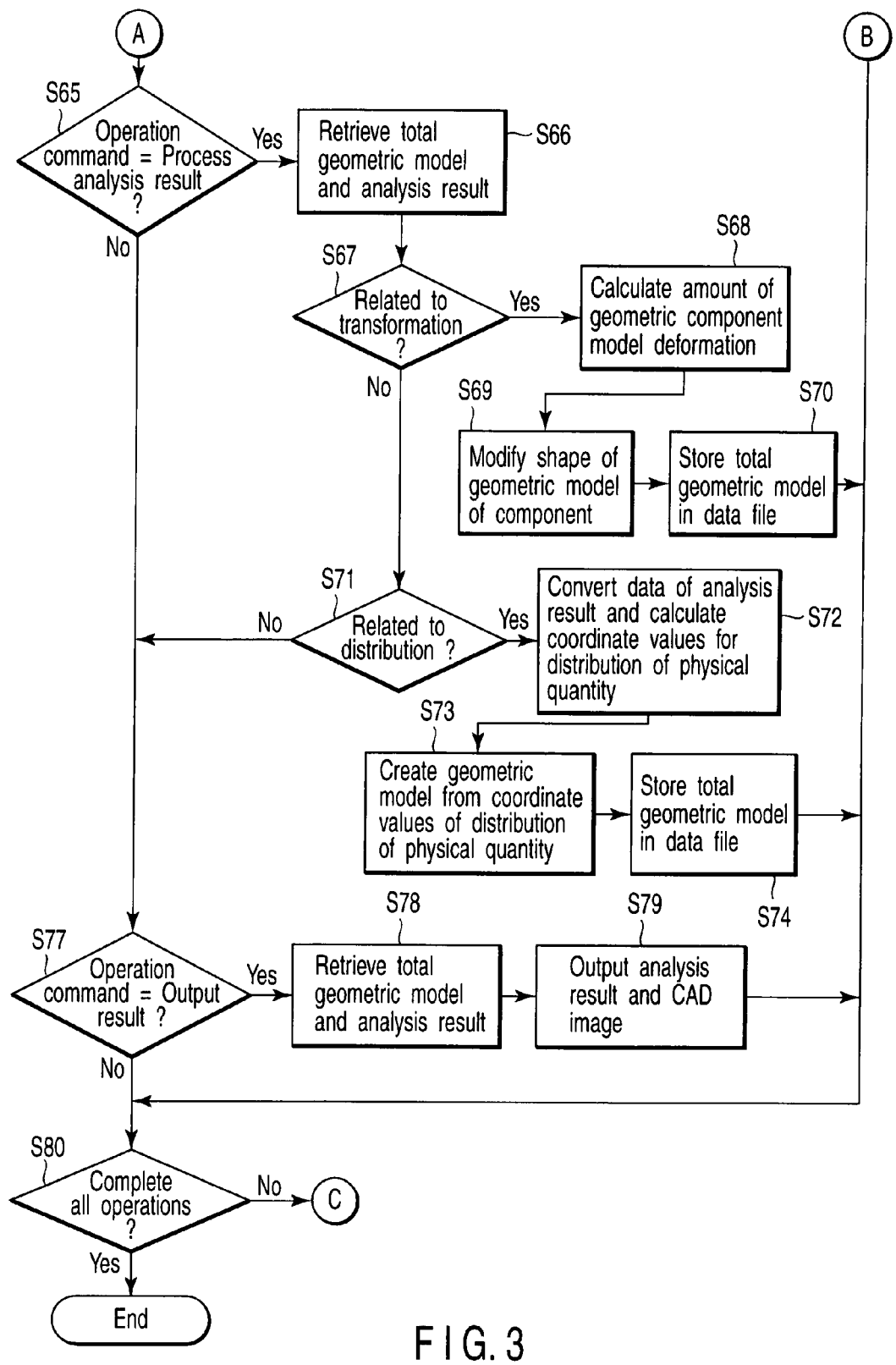
FIG. 3 is an exemplary flowchart that shows an operation of the design verification simulation CAD system.

The operation of the system configured as above is explained next, with reference to the flowcharts of FIGS. 2 and 3.

First, the operator inputs operation commands and data such as dimensions on the input device 21 into the system main section 22, by referring to the design specification and plans (Step S31). The input command process determining section 24 of the system main section 22 determines what the input command is, and sends the command to a processing section that corresponds to the command.

The input command process determining section 24 determines whether or not the input command indicates "create component" (Step S32). When the section determines that it indicates "create component" (Yes in Step S32), the shape model creating section 25 creates a shape model of the component (Step S33) and stores it in the data file storing section 23 (Step S35).

When the input command does not indicate "create component" (No in Step S32), it is determined whether or not the command indicates "modify shape of component" (Step S36). When it indicates "modify shape of component" (Yes in Step S36), the shape model creating section 25 retrieves the shape model of the designated component and modifies the shape of the component (Step S37). The modified shape is stored in the data file storing section 23 (Step S39).

When the input command does not indicate "modify shape of component" (No in Step S36), it is determined whether or not the command indicates "reposition component" (Step S44). When the input command indicates "reposition component" (Yes in Step S44), the total model building section 26 retrieves the total shape model from the data file storing section 23, and repositions the shape model of the designated component (Step S45). The resultant total shape model is stored in the data file storing section 23 (Step S47).

When the input command does not indicate "reposition component" (No in Step S44), it is determined whether or not the command indicates "add component" (Step S48). When the input command indicates "add component" (Yes in Step S48), the total model building section 26 retrieves the total shape model from the data file storing section 23 and adds thereto a shape model of a component of interest (Step S49). The resultant total model is stored in the data file storing section 23 (Step S52).

When the input command does not indicate "add component" (No in Step S48), it is determined whether or not the command indicates "design specifications" (Step S54). When the input command indicates "design specifications" (Yes in Step S54), the design verification simulation executing section 28 retrieves the total shape model from the data file storing section 23 (Step S55). Then, the operator designates the shape model of a component of interest and its location and sets up design specifications such as load conditions, material constants, connections between components and installation (Step S56). The design verification simulation executing section 28 stores the shape model, location and design specifications of the designated component in the data file storing section 23 (Step S57).

When the input command does not indicate "design specifications" (No in Step S54), it is determined whether or not the command indicates "execute analysis" (Step S59). When the input command indicates "execute analysis" (Yes in Step S59), the design verification simulation executing section 28 retrieves the shape model and location of a designated component, the design specifications and the total shape model from the data file storing unit 23 (Step S60). The section 28 generates a mesh and creates an analysis model with boundary conditions set up on the basis of the design specifications to execute analysis simulation, which is design verification (Step S61). Then, the analysis is executed (Step S62). The design verification simulation executing section 28 stores the analysis model and the analysis results in the data file storing section 23 (Step S63).

When the input command does not indicate "execute analysis" (No in Step S59), it is determined whether or not the command indicates "manipulate analysis results" (Step S65). When the input command indicates "manipulate analysis results" (Yes in Step S65), the design verification simulation result manipulating section 29 retrieves the total shape model, analysis model, and analysis results from the data file storing section 23 (Step S66). The design verification simulation result manipulating section 29 determines whether or not the analysis results relate to deformation (Step S67). When the analysis results relate to deformation (Yes in Step S67), the design verification simulation result manipulating section 29 converts data on the displacement coordinate values obtained as a result of analysis to find a difference between those coordinates and the original shape data of the component and thereby calculates the amount of shape component model deformation (Step S68). The design verification simulation result manipulating section 29 modifies the shape of the shape model of the component on the basis of the calculated amount of shape component model deformation (Step S69). The design verification simulation result manipulating section 29 then stores the modified total shape model in the data file storing section 23 (Step 70).

When determining that the analysis results do not relate to deformation (No in Step S67), the design verification simulation result manipulating section 29 determines whether or not the analysis results relate to distribution of physical quantities (Step S71). When determining that the analysis results relate to distribution of physical quantities (Yes in Step S71), the design verification simulation result manipulating section 29 converts data of physical quantities (such as temperature, electromagnetic wave, current speed and pressure) obtained as a result of the analysis and thereby calculates distribution coordinate values (Step S72). The design verification simulation result manipulating section 29 creates a shape model on the basis of the distribution coordinate values of the physical quantities and incorporates them into the total shape model (Step S73), and the section 29 stores the resultant total shape model in the data file storing section 23 (Step S74).

When it is determined that the analysis results do not indicate "manipulate analysis results (No in Step S65) or that the analysis results do not relate to the distribution of physical quantities (No in Step S71), it is determined whether or not the input command indicates "output results" (Step S77).

When the input command indicates "output results" (Yes in Step S77), the CAD image outputting section 30 retrieves the analysis results of the total shape model (Step S78), and outputs the analysis results and the CAD image (Step S79). The analysis results and the CAD image are illustrated in FIGS. 4A to 4C and 5A to 5C.

Figure 4A:
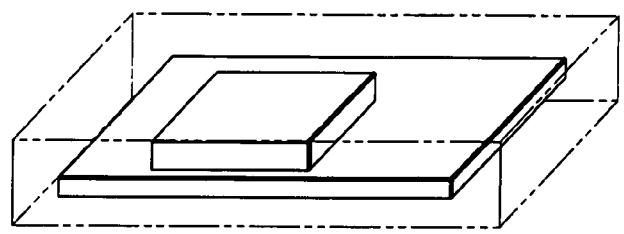
FIG. 4A, FIG. 4B, and FIG. 4C are conceptual diagrams of a frame design for which deformation is taken into consideration.
Figure 4B:
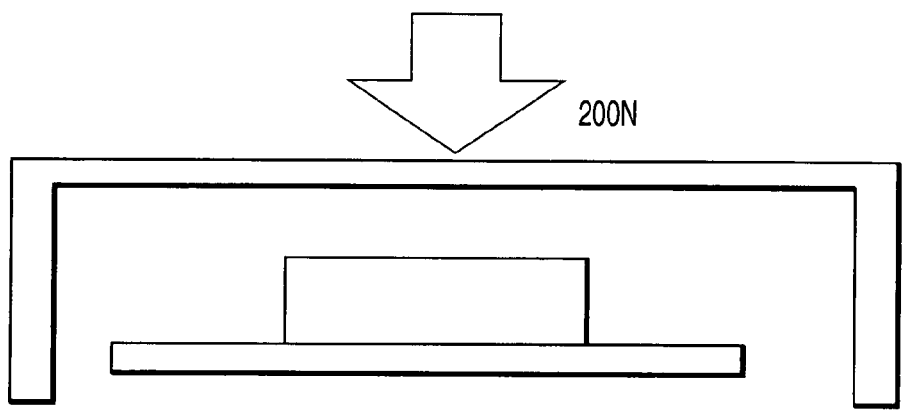
Figure 4C:
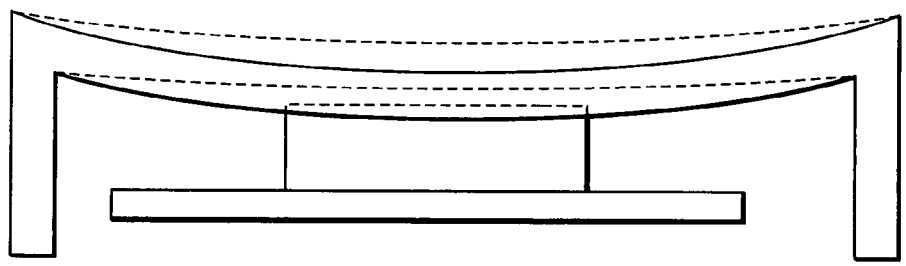

As observing the CAD image, the operator checks whether or not the design specifications are satisfied, by visual observation and also by interference determination, distance measurement and the like. The component deformation verifying performances are illustrated in detail in FIGS. 4A to 4C. A designed structure of FIG. 4A whose frame is pressed down will be considered. Here, it is assumed that the structure is under a load of 200N as a design specification (FIG. 4B). With the aforementioned operations, deformation under the 200N load is incorporated into the shape model of the frame component (FIG. 4C). The frame may not have any interference with the internal electronic components without being deformed under load, but when deformation under load is taken into account, interference with an internal electronic component may arise. One should design resistible frame components with such deformation taken into account.

Figure 5A:
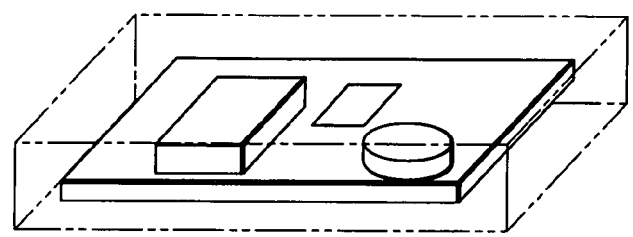
FIG. 5A, FIG. 5A, and FIG. 5C are conceptual diagrams of a design in which areas with a high noise level are avoided.
Figure 5B:
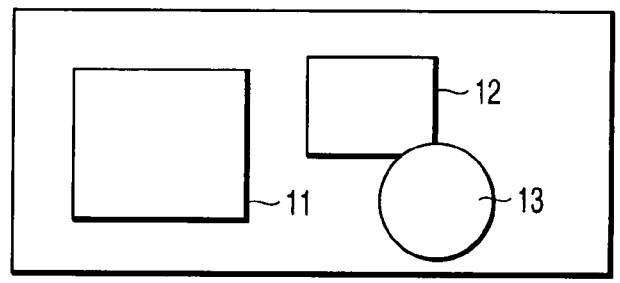
Figure 5C:
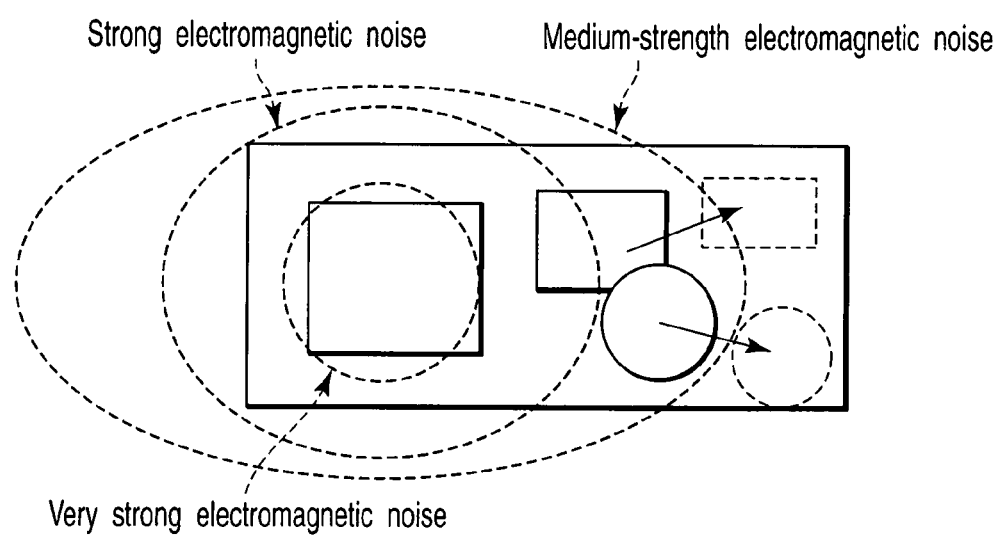

The performances and electromagnetic noises of the invention are illustrated in FIGS. 5A to 5C. In the designed structure of FIG. 5A, a component 13 is added onto the board in the vicinity of a component 11 that causes electromagnetic noise, and a hole 12 is to be formed therein in order to reduce the weight of the structure (FIG. 5B). By analyzing the electromagnetic field around the electromagnetic-noise causing component with the aforementioned procedure, the distribution of electromagnetic noise is indicated on the board in the CAD image (FIG. 5C). Because electromagnetic noise can be handled as shape data in a similar manner to components, noise interference can be determined on the CAD image. The position and shape of the hole for weight reduction and the arrangement of the additional component are thereby modified by visual observation and interference determination in such a manner that they do not fall in a "strong" or "medium" area of the electromagnetic noise distribution.

The above procedure is repeated until the designing operation is completed (Step S80).

The present invention realizes design verification by executing analysis and simulation on the basis of design specifications during a CAD operation. The results of the analysis are incorporated directly into the CAD system for checking. Furthermore, a high-level design verification is conducted by determining interference with shape models of other components and calculating distances to these components, or by visually observing graphic images. This saves an operator from having to go between the CAD system and the CAE system and reduces time required for design modification. Thus, the present invention remarkably improves the designing quality.

All the processes of the embodiment are realized by computer programs. Hence, simply by installing these computer programs on an ordinary computer by way of a computer-readable storage medium, the same effect as in the present embodiment can be readily realized. Moreover, those computer programs run not only on a personal computer but also on any electronic device that has a processor therein.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A CAD system comprising:
   a model building section which builds a total model by combining shape models of frame components and internal components of a designed appliance;
   a design verification simulation executing section which executes analysis simulation which serves design verification by running a simulation of the total model built by the model building section in accordance with a design specification; and
   a simulation result manipulating section which forms a model from the total model modified in accordance with a result of the analysis executed by the design verification simulation executing section.

2. The CAD system according to claim 1, wherein, the simulation result manipulating section modifies a shape of the total model by converting data of the result of the analysis simulation, when the result of the analysis simulation indicates deformation.

3. The CAD system according to claim 1, wherein, the simulation result manipulating section forms a shape model based on coordinate values of the distribution of the physical quantity and incorporates the formed shape model into the total model, when the result of the analysis simulation indicates distribution of physical quantity.

4. The CAD system according to claim 3, wherein the physical quantity relates to any one of a temperature, an electromagnetic wave, a current speed and a pressure.

5. The CAD system according to claim 1, wherein the design specification relates to any one of a load, a material constant, a component relationship and component installation.

6. A designing and analyzing method comprising:
   building a total model by combining shape models of frame components and internal components of a designed appliance;
   executing analysis simulation which serves design verification by running a simulation of the total model in accordance with a design specification; and
   forming a model from the total model modified in accordance with a result of the analysis.

7. The designing and analyzing method according to claim 6, wherein, a shape of the total model is modified by converting data of the result of the analysis, when the result of the analysis simulation indicates deformation.

8. The designing and analyzing method according to claim 6, wherein, a shape model is formed based on coordinate values of the distribution of the physical quantity, and the formed shape model is incorporated into the total model, when the result of the analysis simulation indicates distribution of physical quantity.

9. The designing and analyzing method according to claim 8, the physical quantity relates to any one of a temperature, an electromagnetic wave, a current speed and a pressure.

10. The designing and analyzing method according to claim 6, wherein the design specification relates to any one of a load, a material constant, a component relationship and component installation.

11. A program which is stored in a computer readable media and cause a computer to perform designing and verifying an appliance, comprising:
    causing the computer to build a total model by combining shape models of frame components and internal components of the designed appliance;
    causing the computer to execute an analysis simulation which serves design verification by running a simulation of the total model in accordance with a design specification; and
    causing the computer to form a model from the total model modified in accordance with a result of the analysis.

* * * * *